United States Patent [19]
Lee et al.

[11] Patent Number: 5,166,101
[45] Date of Patent: Nov. 24, 1992

[54] METHOD FOR FORMING A BORON PHOSPHORUS SILICATE GLASS COMPOSITE LAYER ON A SEMICONDUCTOR WAFER

[75] Inventors: Peter W. Lee, Fremont; David N. K. Wang, Saratoga, both of Calif.; Makoto Nagashima, Machida, Japan; Kazuto Fukuma, Osaka, Japan; Tetsuya Sato, Narita, Japan

[73] Assignee: Applied Materials, Inc., Santa Clara, Calif.

[21] Appl. No.: 649,172

[22] Filed: Feb. 1, 1991

Related U.S. Application Data

[63] Continuation of Ser. No. 413,800, Sep. 28, 1989, abandoned.

[51] Int. Cl.$^5$ .............. H01L 21/00; H01L 21/02; H01L 21/90; H01L 21/95
[52] U.S. Cl. .............. 437/238; 437/235; 437/240; 148/DIG. 118
[58] Field of Search ............ 437/225, 228, 235, 238, 437/240; 427/38, 39, 51; 204/192.12, 192.37; 148/DIG. 118

[56] References Cited

U.S. PATENT DOCUMENTS

4,708,884 12/1987 Chandross et al. ............... 427/51
4,872,947 10/1989 Wang et al. ............... 204/192.12
4,892,753 1/1990 Wang et al. ............... 427/38

FOREIGN PATENT DOCUMENTS

0272140 6/1988 European Pat. Off. .
0037638 2/1988 Japan .

OTHER PUBLICATIONS

Avigal, Inter-Metal Dielectric and Passivation-Related Properties of Plasma PBSG, Solid State Tech., Oct. 1983, pp. 217-224.
Kern, Borophosphosilicate Glasses for Integrated Circuits, Solid State Tech., Jun. 1985, pp. 171-179.
Tong, Process and Film Characterization of PECVD Borophosphosilicate Films for VLSI Applications, Solid State Tech., Jan. 1984, pp. 161-170.
Wolf, S., Silicon Processing for the VLSI Era, vol. 1, Lattice Press, 1986, pp. 188-191.
Becker, Process and film characterization of low pressure tetraethylorthosilicate-borophosphosilicate glass, J. Vac. Si. Tech. B, 4(3), Jun. 1986, pp. 732-744.
Shioya, Comparison of Phosphosilicate Glass Films Deposited by Three Different Chemical Vapor Deposition Methods, J. of the Electrochem. Society, vol. 133, No. 9, Sep. 1986, pp. 1943-1950.

*Primary Examiner*—Brian E. Hearn
*Assistant Examiner*—B. Everhart
*Attorney, Agent, or Firm*—John P. Taylor

[57] ABSTRACT

A composite BPSG insulating and planarizing layer is formed over stepped surfaces of a semiconductor wafer by a novel two step process. The composite BPSG layer is characterized by the absence of discernible voids and a surface which is resistant to loss of boron in a subsequent etching step. The two step deposition process comprises a first step to form a void-free BPSG layer by a CVD deposition using gaseous sources of phosphorus and boron dopants and tetraethylorthosilicate (TEOS) as the source of silicon; and then a second step to form a capping layer of BPSG by a plasma-assisted CVD deposition process while again using gaseous sources of phosphorus and boron dpoants, and TEOS as the source of silicon, to provide a BPSG cap layer having a surface which is non-hygroscopic and resistant to loss of boron by subsequent etching.

17 Claims, 2 Drawing Sheets

```
┌─────────────────────────────────────┐
│   FORMING A COMPOSITE BORON PHOSPHORUS │
│     SILICATE GLASS (BPSG) LAYER ON A   │
│    STEPPED SURFACE OF A SEMICONDUCTOR  │
│        WAFER BY A TWO STEP PROCESS     │
└─────────────────────────────────────┘
                   │
┌─────────────────────────────────────┐
│     FORMING A FIRST BPSG LAYER ON THE  │
│   STEPPED SEMICONDUCTOR WAFER SURFACE  │
│       BY A CVD PROCESS WHILE FLOWING   │
│   GASEOUS SOURCES OF BORON, PHOSPHORUS,│
│    OXYGEN, AND TETRAETHYLORTHOSILICATE │
│            INTO A VACUUM CHAMBER       │
└─────────────────────────────────────┘
                   │
┌─────────────────────────────────────┐
│   THEN FORMING A SECOND BPSG CAP LAYER │
│    OVER THE FIRST BPSG LAYER BY IGNITING│
│    A PLASMA IN THE VACUUM CHAMBER WHILE│
│    CONTINUING TO FLOW THE GASEOUS SOURCES│
│        OF BORON, PHOSPHORUS, OXYGEN, AND│
│   TETRAETHYLORTHOSILICATE INTO THE CHAMBER│
└─────────────────────────────────────┘
```

FIG. 3

METHOD FOR FORMING A BORON PHOSPHORUS SILICATE GLASS COMPOSITE LAYER ON A SEMICONDUCTOR WAFER

This is a continuation of copending application Ser. No. 07/413,800 filed on Sep. 28, 1989, now abandoned.

BACKGROUND OF THE INVENTION

1. Field of the Invention

This invention relates to the processing of semiconductor wafers. More particularly, this invention relates to the formation of a boron phosphorus silicate glass composite layer on a semiconductor wafer and an improved method of forming same.

2. Description of the Related Art

Boron phosphorus silicate glass (BPSG) has been used as an insulating layer applied over stepped surfaces of integrated circuit structures formed on semiconductor wafers. BPSG is used over stepped surfaces because of its low melting temperature which permits subsequent heating of the layer to flow the glass to thereby planarize the structure.

Various processes have been used to form the BPSG layer over the stepped surface on the semiconductor wafer. A plasma-assisted chemical vapor deposition (CVD) process using silane ($SiH_4$) together with boron and phosphorus doping materials such as, for example, trimethylphosphate (TMP) and trimethylborate (TMB), has been used in the past.

However, one problem which can occur when forming such a layer over stepped surfaces resulting from, for example, closely spaced apart raised lines or narrow trenches, is that of the formation of voids.

Referring to FIG. 1, which shows a prior art formation of a boron phosphorus silicate layer 30, an integrated circuit structure 10 is shown having trenches 24 and raised lines 20 thereon which may, for example, be metal or polysilicon lines.

When such a prior art BPSG layer 30 is applied over the structure, void formation, indicated at 34, occurs in the cavities between closely spaced apart lines 20 or in narrow trenches 24 when the material of BPSG layer 30 being formed deposits or grows on the sidewalls of the cavities, comprising either the space between adjacent lines 20 or the space in trenches 24, faster than it grows or deposits on the bottom of the cavities so that the side surfaces neck together at or near the top of the cavity before the cavity is completely filled, leaving voids or unfilled spaces 34 in the cavity which, upon subsequent sectioning of the wafer, can be visually seen by a 2000× power microscope.

When a plasma-assisted CVD silane process, such as described above, is utilized in the construction of VLSI integrated circuit structures, such as 1 megabit DRAMs, where spacing between metal lines is about 1.2 microns or less, only about 30% to 50% of the resulting step coverage is free of such voids.

With the increasing density of integrated circuit structures, for example, in the construction of 4 and 16 megabit DRAMs, the step coverage of a BPSG layer formed by such a plasma-assisted CVD silane process is unacceptable. Because of this, improved processes have been developed for forming BPSG insulating layers over stepped semiconductor wafers having fine pitch lines or high aspect ratio trenches, e.g., 0.5 to 1 micron spacing between lines or sidewalls of trenches.

One such process is a plasma-assisted CVD process which utilizes tetraethylorthosilicate (TEOS) as the source of silicon together with $O_3$, and boron and phosphorus dopants to form the BPSG layer. While this process results in better step coverage, the result is still only about 70% void-free coverage of lines having 0.8 to 1 micron spacing such as found in 4 megabit DRAMs.

A CVD process which uses tetraethylorthosilicate as the source of silicon and which does not utilize a plasma, but uses pressures ranging from 60 Torr up to atmospheric pressure (760 Torr), has also been developed for depositing BPSG layers. Use of this process has resulted in 100% void-free step coverage over lines spaced as close as 0.5 microns. Typically, formation of a BPSG layer with a non-plasma-assisted process includes the further steps of densifying the CVD formed BPSG layer at temperatures of about 700° C., followed by a wet etch to clean the wafer, and then a final high temperature flow step to planarize the structure.

The densification step, however, takes time and also generates undesirable particles, while the wet etch step preferentially leaches out boron from the BPSG layer and attacks the sidewalls of the steps or trenches. Furthermore, the BPSG layer formed by this prior art process has high tensile stress, resulting in cracks in the layer. The BPSG layer formed by this process also is hygroscopic, and moisture adsorbed into the layer can result in conversion of the boron dopant in the glass to $B_2O_3$ or even recrystallization of the boron to boric acid.

There remains a need for a BPSG layer formed on a stepped surface of a semiconductor wafer, and an improved method for making same, wherein voids will not be formed in the BPSG layer as it deposits in the areas between closely spaced raised lines and/or high aspect ratio trenches, and wherein the surface of the BPSG layer is not hygroscopic in other ways subject to loss of boron from the layer which could, otherwise, affect the ability to flow the glass to planarize the structure.

SUMMARY OF THE INVENTION

It is, therefore, an object of this invention to provide a composite BPSG layer on a stepped surface of a semiconductor wafer characterized by the absence of voids in areas between closely spaced apart raised portions of the wafer and having a surface which is not hygroscopic to mitigate loss of boron from the BPSG layer.

It is another object of this invention to provide a composite BPSG layer on a stepped surface of a semiconductor wafer by a first step comprising a CVD TEOS deposition which results in the formation of a BPSG layer essentially free of voids in areas between closely spaced apart raised portions of the wafer and a second step comprising a plasma-assisted TEOS deposition over the CVD TEOS layer which results in the formation of a BPSG cap layer having a surface which is not hygroscopic to mitigate loss of boron from the BPSG layer.

It is yet another object of this invention to provide a composite BPSG layer on a stepped surface of a semiconductor wafer by a first step comprising a CVD TEOS deposition to form a first BPSG layer comprising from about 80% to about 95% of the desired thickness of the composite BPSG layer essentially free of voids in areas between closely spaced apart raised portions of the wafer; and a second step comprising a plasma-assisted TEOS deposition over the CVD TEOS layer to form a capping layer of BPSG comprising from about 5% to about 20% of the desired thickness of the composite BPSG layer resulting in the formation of a BPSG layer surface which is not hygroscopic to mitigate loss of boron from the BPSG layer.

It is a further object of this invention to provide an improved process for depositing a composite BPSG layer on a stepped surface of a semiconductor wafer which will not result in the formation of voids in areas between closely spaced apart raised portions of the wafer and which will result in the formation of a BPSG layer surface which is not hygroscopic to mitigate loss of boron from the BPSG layer by a first step comprising a CVD TEOS deposition to form a first BPSG layer; and a second step comprising a plasma-assisted TEOS deposition of a cap layer of BPSG over the CVD TEOS layer of BPSG.

These and other objects of the invention will be apparent from the following description and accompanying drawings.

BRIEF DESCRIPTION OF THE DRAWINGS

FIG. 3 is a flowsheet illustrating the process of the invention.

DETAILED DESCRIPTION OF THE INVENTION

In accordance with the invention, a composite BPSG insulating and planarizing layer is formed over stepped surfaces of a semiconductor wafer by a novel two step process. The composite BPSG layer is characterized by the absence of discernible voids and a surface which is resistant to loss of boron in a subsequent etching step.

Figure 1:
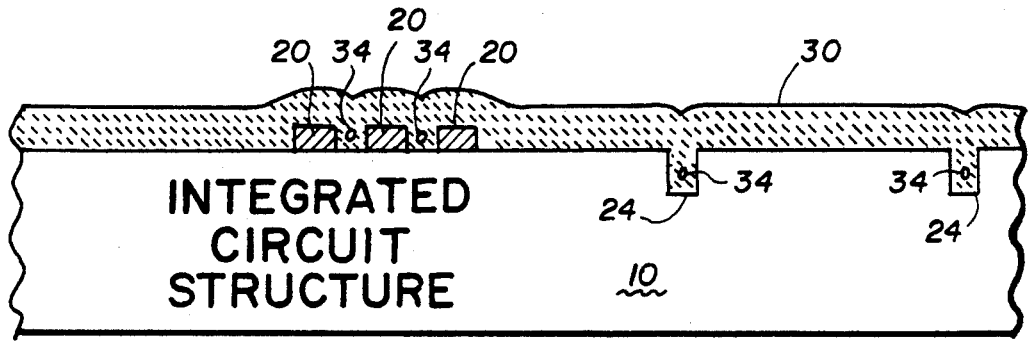
FIG. 1 is a vertical cross-sectional view of a prior art structure representing a semiconductor wafer with a stepped surface formed by closely spaced apart raised lines and high aspect ratio trenches and a planarizing layer of BPSG with voids shown formed in the cavities between the raised lines and in the trenches.
Figure 2:
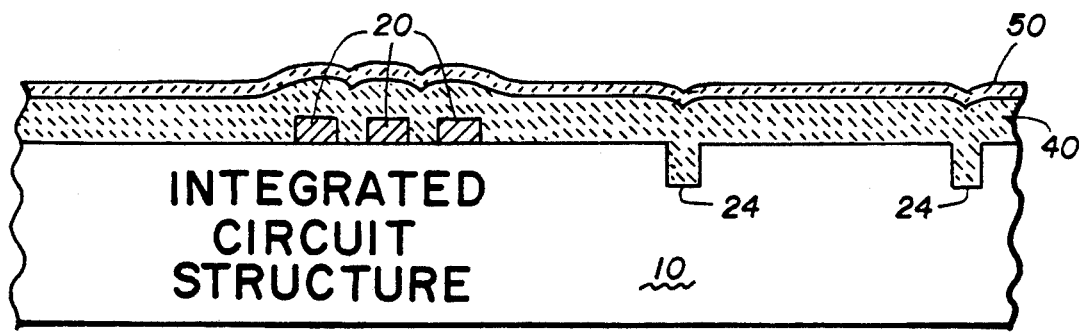
FIG. 2 is a vertical cross-sectional view of a semiconductor wafer having a stepped surface showing the composite BPSG layer of the invention comprising a void-free BPSG layer formed by CVD TEOS deposition and a capping layer of BPSG formed by plasma-assisted CVD TEOS deposition.

The two step deposition process comprises a first step to form a void-free BPSG layer 40, as shown in FIG. 2, by a CVD deposition using gaseous sources of phosphorus and boron dopants and tetraethylorthosilicate (TEOS) as the source of silicon; and then a second step to form a capping layer 50 of BPSG by a plasma-assisted CVD deposition process while again using gaseous sources of phosphorus and boron dopants, and TEOS as the source of silicon, to provide a BPSG cap layer having a surface which is non-hygroscopic and resistant to loss of boron by subsequent etching.

The term "stepped surfaces of a semiconductor wafer", as used herein, is meant to include structures such as raised lines on a wafer surface or a wafer surface having trenches formed therein, particularly high aspect ratio trenches, i.e., trenches with depth to width ratios greater than 1. Therefore, expressions herein, such as "raised portions of the wafer", are meant to describe surface topographies which include both raised lines as well as the sidewalls of narrow trenches formed in the wafer.

For the first deposition step, the semiconductor wafer is placed on a support base or susceptor in a CVD chamber of a vacuum deposition apparatus such as, for example, a 5000 Series System available form Applied Materials, Inc. The wafer and the susceptor are heated to a temperature within a range of from about 390° C. to about 600° C., preferably from about 390° C. to about 499° C., and then maintained within this temperature range throughout the deposition. The chamber is maintained at a pressure within a range of from about 40 Torr to about 760 Torr during the deposition.

A gaseous mixture is then admitted into the deposition chamber comprising one or more gaseous sources of boron, one or more gaseous sources of phosphorus, a gaseous source of oxygen, and tetraethylorthosilicate (TEOS) as the gaseous source of silicon. A carrier gas such as argon, nitrogen, or helium may also be present in the mixture of gases.

The gaseous sources of boron and phosphorus may comprise any gases respectively containing boron or phosphorus and other materials which will not interfere with the glass deposition and which are capable of decomposing to form a gas capable of reacting with both the TEOS and the $O_3$ in the specified pressure and temperature ranges of the process. Preferably, such gaseous sources of boron and phosphorus will be organic boron-containing and phosphorus-containing gases which will decompose at the deposition temperature with the remainder of the components of the gases volatilizing off and being removed by the vacuum pumping system used to maintain the vacuum in the chamber.

Examples of such gaseous sources of boron and phosphorus include triethylphosphine (TEP), trimethylphosphate (TMP), trimethylborate (TMB), (trimethylsilyl)phosphate, (trimethylsilyl)borate, and mixtures of same.

It should be noted, however, that the gaseous sources of boron or phosphorus need not be organic compounds. But the boron and/or phosphorus-containing compound or compounds used must not be so reactive as to react with the $O_3$ before decomposition of the TEOS. Hence, the requirement that the compound be reactive with both the $O_3$ and the decomposition products of the TEOS. It has been found that boron and/or phosphorus-containing organic compounds such as those recited above decompose sufficiently slow under the specified reaction conditions so as to permit the desired reaction with both the $O_3$ and the TEOS decomposition products.

The gaseous sources of boron and phosphorus dopants may be mixed with a suitable nonreactive carrier gas such as argon or helium. The amount of the gaseous sources of boron and phosphorus present in such a carrier gas/gaseous dopant source mixture may range from about 2 to 100 wt. % of the dopant/carrier gas mixture with the balance comprising the carrier gas. It should be noted here that for some volatile organic dopant sources, the use of such a carrier gas is unnecessary.

The gaseous source of boron (or mixture with carrier gas) is flowed into the CVD chamber at a flow standard cubic centimeters per minute (sccm), and the gaseous source of phosphorus (or mixture with carrier gas) is also flowed into the chamber at a rate of from about 10 to about 3000 sccm.

The gaseous source of oxygen may include various oxygen-containing gases including $O_2$, $O_3$, $H_2O_2$, and mixtures of same. Preferably, the gaseous source of oxygen will comprise a mixture of oxygen-containing gases containing at least 1 vol. % $O_3$, e.g., with the balance comprising $O_2$. The gaseous source of oxygen may also include a carrier gas such as helium, argon, or nitrogen. However, at least 10 vol. % of such a mixture must comprise an oxygen-containing gas. The gaseous source of oxygen is flowed into the vacuum deposition chamber at a rate within a range of from about 500 to about 10,000 sccm.

As previously discussed, the source of silicon consists of tetraethylorthosilicate to assure formation of an essentially void-free layer of BPSG. The tetraethylorthosilicate is usually mixed with an inert carrier gas such as argon or helium, or an oxygen-containing carrier gas. The ratio of tetraethylorthosilicate and carrier gas should be from about 0.1 vol. % to about 20 vol. % tetraethylorthosilicate. The flow rate of the tetraethylorthosilicate/carrier gas mixture into the deposition chamber is within a range of from about 100 to about 10,000 sccm.

The ratio of TEOS to $O_3$ may range from about 1:100 to about 2:1, but will typically be about 1:2.

The optimal total flow of the gaseous reactants into the deposition chamber to obtain the highest deposition rate will vary somewhat with the design and geometry of the particular vacuum apparatus utilized for the deposition process. If the flow rate is too high, the deposition rate will be lowered because the residence time of the gas in the chamber is too short for reaction; while use of a low flow rate results in reaction and deposition of the doped glass elsewhere in the vacuum chamber than on the silicon wafer on which the integrated circuit structures have been formed. Usually, the total flow of gases into the vacuum deposition chamber will range from about 650 sccm to about 20,000 sccm.

For example, a flow rate of about 1000 sccm TEOS-containing gas, about 2000 sccm of the $O_3$-containing gas, and about 50 sccm each of the gaseous sources of boron and phosphorus dopants has been found to provide a deposition rate of at least about 1500 Angstroms/minute using a deposition chamber in a 5000 Series vacuum apparatus available from Applied Materials, Inc.

In accordance with the invention, the deposition time will, therefore, be controlled to permit deposition of from about 80% to about 95% of the total desired thickness of the BPSG layer in this first step of CVD deposition with the remaining 5% to 20% of the thickness formed in a second deposition step as will now be described.

This second deposition step is carried out under conditions identical to the first deposition step with regard to temperature, pressure, gaseous components, and flow rates except that during the deposition, a plasma is ignited between the susceptor on which the wafer rests and the faceplate or "showerhead" through which the gases flow into the chamber. The power level of the plasma during the plasma-assisted CVD deposition may range from about 25 to about 500 watts, preferably, from about 50 to about 200 watts.

This second deposition step results in the formation of a non-porous and non-hygroscopic BPSG cap layer over the CVD-formed BPSG layer which cap is resistant to leaching out of the boron dopant in the glass during a subsequent wet etching step to remove impurities such as other metals from the surface of the BPSG layer prior to heating of the newly formed BPSG layer to planarize the structure.

To further illustrate the practice of the invention, a silicon wafer, having a raised pattern of polysilicon previously formed thereon, was placed in a vacuum deposition chamber of an Applied Materials 5000 Series vacuum apparatus under a vacuum of about 500 Torr and heated to a temperature of about 390° C. A mixture of gases was flowed over the wafer consisting of about 1000 sccm of TEOS (4 mole percent TEOS/ balance helium), about 2000 sccm of $O_3$ (8 wt. % $O_3$/92 wt. % $O_2$), and about 20 sccm each of triethylphosphine and trimethylborate (both dopant sources used without carrier gas) for about 2 minutes to deposit a boron phosphosilicate glass layer of about 0.8 microns in thickness on the patterned silicon wafer.

A plasma was then ignited in the chamber to a power level of 100 watts and the process was carried out for an additional 20 seconds to form a 0.1 micron plasma-assisted CVD boron phosphosilicate glass cap layer over the CVD-formed BPSG layer.

The wafer was then removed from the vacuum chamber and wet cleaned by dipping in a $H_2SO_4$ $H_2O_2$:$H_2O$ solution for 10 minutes to remove impurities from the newly formed BPSG surface. The wafer was then heated to 850° C. for 30 minutes to allow the composite BPSG layer to flow to planarize the wafer. The wafer surface was visually inspected for cracking of the BPSG layer, indicative of stress cracking. No such cracking was observed.

The wafer was then sectioned and examined under a $2000\times$ microscope for the presence of voids in the BPSG layer in the filled in regions between the polysilicon lines. No visible signs of voids were found. The examination further showed that the glass had flowed satisfactorily, indicating that no boron had leached out of the glass.

The surface of the cap layer was examined for the presence of water by Fourier Transform Infrared Spectroscopy (FTIR Spectroscopy). No evidence of water pickup was found. The coated wafer was then exposed to ambient conditions for several days after which the surface was again examined by FTIR Spectroscopy. No water pickup was observed, indicative of the low hygroscopicity of the cap layer.

Thus, the invention provides an improved process for forming a planarizing BPSG layer on a semiconductor wafer wherein a BPSG layer essentially free of voids is formed in a first CVD step using a gaseous mixture of $O_3$, TEOS, and phosphorus and boron dopants; and then depositing a cap layer of BPSG which is non-hygroscopic and resistant to leaching out of the boron dopant in a second deposition step comprising a plasma-assisted CVD process.

Having thus described the invention, what is claimed is:

1. A process for forming a composite layer of boron phosphorus silicate glass (BPSG) over stepped surfaces of a semiconductor wafer which comprises:
  (a) depositing a first CVD base layer of BPSG on said wafer, in a vacuum chamber, by flowing into said vacuum chamber a mixture of gases comprising one or more gaseous sources of boron, one or more gaseous sources of phosphorus, a gaseous source of oxygen containing at least 1 vol. % $O_3$, and tetraethylorthosilicate (TEOS) as the gaseous source of silicon, with the ratio of TEOS to $O_3$ ranging from about 1:100 to about 2:1; and
  (b) depositing a plasma assisted CVD capping layer of BPSG over said CVD layer, in said vacuum chamber, by using a mixture of gases comprising one or more gaseous sources of boron, one or more gaseous sources of phosphorus, a gaseous source of oxygen containing at least 1 vol. % O$_3$, and TEOS as the gaseous source of silicon, with the ratio of TEOS to O$_3$ ranging from about 1:100 to about 2:1, while maintaining a plasma in said chamber at a power level of at least about 25 watts.

2. The process of claim 1 which further comprises depositing from about 80% to about 95% of the desired thickness of said composite BPSG layer in said first step of CVD deposition and from about 5% to about 20% of the desired thickness of said composite BPSG layer during said second step of plasma-assisted CVD deposition.

3. The process of claim 1 which further comprises maintaining a flow rate into said vacuum chamber of said gaseous source of boron within a range of from about 10 sccm to about 3000 sccm during said deposition steps.

4. The process of claim 1 which further comprises maintaining a flow rate into said vacuum chamber of said gaseous source of phosphorus within a range of from about 10 sccm to about 3000 sccm during said deposition steps.

5. The process of claim 1 which further comprises maintaining a flow rate into said vacuum chamber of said gaseous source of oxygen within a range of from about 500 sccm to about 10,000 sccm during said deposition steps.

6. The process of claim 1 which further comprises maintaining a flow rate into said vacuum chamber of said gaseous TEOS within a range of from about 100 sccm to about 10,000 sccm during said deposition steps.

7. The process of claim 1 which further comprises maintaining a total flow rate into said vacuum chamber of said gaseous sources of boron, phosphorus, oxygen, and TEOS within a range of from about 650 sccm to about 20,000 sccm during said deposition steps.

8. The process of claim 1 wherein said gaseous source of boron is selected from the class consisting of trimethylborate, (trimethylsilyl)borate, and mixtures of same.

9. The process of claim 1 wherein said gaseous source of phosphorus is selected from the class consisting of triethylphosphine, trimethylphosphate, (trimethylsilyl)phosphate, and mixtures of same.

10. The process of claim 1 wherein said gaseous source of oxygen further comprises one or more gases selected from the class consisting of O$_2$, H$_2$O$_2$, helium, argon, and nitrogen.

11. A process for forming a composite layer of boron phosphorus silicate glass (BPSG) over stepped surfaces of a semiconductor wafer which comprises:
(a) depositing a first CVD base layer of BPSG on said wafer, in a vacuum chamber, comprising from about 80% to about 95% of the total thickness of said composite BPSG layer, by flowing into said vacuum chamber a mixture of gases comprising: one or more gaseous sources of boron having a flow rate within a range of from about 10 sccm to about 3000 sccm, one or more gaseous sources of phosphorus having a flow rate within a range of from about 10 sccm about 3000 sccm, one or more gaseous sources of oxygen having a flow rate within a range of from about 500 sccm to about 10,000 sccm, and tetraethylorthosilicate as the gaseous source of silicon having a flow rate within a range of from about 100 sccm to about 10,000 sccm; and
(b) depositing a plasma assisted CVD capping layer of BPSG over said CVD layer, in a vacuum chamber, comprising from about 5% to about 20% of the total thickness of said composite BPSG layer, by igniting a plasma in said vacuum chamber having a power level of at least about 25 watts while continuing to flow said mixture of said one or more gaseous sources of boron, said one or more gaseous sources of phosphorus, said one or more gaseous sources of oxygen, and said tetraethylorthosilicate into said vacuum chamber.

12. A process for forming a composite layer of boron phosphorus silicate glass (BPSG) over stepped surfaces of a semiconductor wafer to provide a layer without visible signs of voids and a surface which is non-hygroscopic and resistant to loss of boron during subsequent etching which comprises:
(a) depositing a first CVD base layer of BPSG on a wafer heated to a temperature within a range of from about 390° C. to about 600° C., in a vacuum chamber maintained at a pressure within a range of from about 40 Torr to about 760 Torr, by flowing into said vacuum chamber a mixture of gases comprising one or more gaseous sources of boron, one or more gaseous sources of phosphorus, a gaseous source of oxygen containing at least 1 vol. % O$_3$, and tetraethylorthosilicate (TEOS) as the gaseous source of silicon, with the ratio of TEOS to O$_3$ ranging from about 1:100 to about 2:1; and
(a) depositing a first CVD base layer of BPSG on a wafer heated to a temperature within a range of from about 390° C. to about 600° C., in a vacuum chamber maintained at a pressure within a range of from about 40 Torr to about 760 Torr, by flowing into said vacuum chamber a mixture of gases comprising one or more gaseous sources of boron, one or more gaseous sources of phosphorus, a gaseous source of oxygen containing at least 1 vol. %, O$_3$, and tetraethylorthosilicate (TEOS) as the gaseous source of silicon, with the ratio of TEOS to O$_3$ ranging from about 1:100 to about 2:1; and
(b) depositing a plasma assisted CVD capping layer of BPSG over said CVD layer on said wafer heated to a temperature within a range of from about 390° C. to about 600° C., in a vacuum chamber maintained at a pressure within a range of from about 40 Torr to about 760 Torr, by using a mixture of gases comprising one or more gaseous sources of boron, one or more gaseous sources of phosphorus, a gaseous source of oxygen containing at least 1 vol. % O$_3$, and tetraethylorthosilicate (TEOS) as the gaseous source of silicon, with the ratio of TEOS to O$_3$ ranging from about 1:100 to about 2:1; while maintaining a plasma in said chamber at a power level ranging from about 25 to about 500 watts.

13. A process for forming a composite layer of boron phosphorus silicate glass (BPSG) over stepped surfaces of a semiconductor wafer to provide a layer essentially free of discernible voids and a surface which is non-hygroscopic and resistant to loss of boron during subsequent etching which comprises:
(a) depositing a first CVD base layer of BPSG on a wafer heated to a temperature within a range of from about 390° C. to about 499° C., in a vacuum chamber maintained at a pressure within a range of from about 40 Torr to about 760 Torr, by flowing into said vacuum chamber a mixture of gases comprising:
(i) one or more gaseous sources of boron;

(ii) one or more gaseous sources of phosphorus;
(iii) a gaseous source of oxygen selected from the class consisting of $O_2$, $O_3$, $H_2O_2$, and mixtures of same, with said oxygen source comprising at least 1 vol. % $O_3$; and
(iv) tetraethylorthosilicate (TEOS) as the gaseous source of silicon;
with the ratio of TEOS to $O_3$ ranging from about 1:100 to about 2:1; and
(b) depositing a plasma assisted CVD capping layer of BPSG over said CVD layer on said wafer heated to a temperature within a range of from about 390° C. to about 499° C., in a vacuum chamber maintained at a pressure within a range of from about 40 Torr to about 760 Torr, by using a mixture of gases comprising:
(i) one or more gaseous sources of boron;
(ii) one or more gaseous sources of phosphorus;
(iii) a gaseous source of oxygen selected from the class consisting of $O_2$, $O_3$, $H_2O_2$, and mixtures of same, with said oxygen source comprising at least 1 vol. % $O_3$; and
(iv) tetraethylorthosilicate (TEOS) as the gaseous source of silicon;
with the ratio of TEOS to $O_3$ ranging from about 1:100 to about 2:1; while maintaining a plasma in said chamber at a power level ranging from about 25 to about 200 watts.

14. A process for forming a composite layer of boron phosphorus silicate glass (BPSG) over stepped surfaces of a semiconductor wafer comprising a void-free first BPSG layer and a non-porous and non-hygroscopic BPSG cap layer which comprises:
depositing a first CVD base layer of BPSG on said wafer, in a vacuum chamber, by flowing into said vacuum chamber a mixture of gases comprising:
(i) one or more gaseous sources of boron;
(ii) one or more gaseous sources of phosphorus;
(iii) a gaseous source of oxygen containing at least 1 vol. % $O_3$, and
(iv) tetraethylorthosilicate (TEOS) as the gaseous source of silicon;
to form said void-free first BPSG layer; and
(b) depositing a plasma assisted CVD capping layer of BPSG over said CVD layer, in a vacuum chamber, by using a mixture of gases comprising:
(i) one or more gaseous sources of boron;
(ii) one or more gaseous sources of phosphorus;
(iii) a gaseous source of oxygen containing at least 1 vol. % $O_3$, and
(iv) tetraethylorthosilicate (TEOS) as the gaseous source of silicon;
while maintaining a plasma in said chamber at a power level of at least about 25 watts to form said non-porous and non-hygroscopic BPSG cap layer.

15. A process for forming a composite layer of boron phosphorus silicate glass (BPSG) over stepped surfaces of a semiconductor wafer comprising a void-free first BPSG layer and a non-porous and non-hygroscopic BPSG cap layer which comprises:
(a) depositing a first CVD base layer of BPSG on said wafer, in a vacuum chamber, by flowing into said vacuum chamber a mixture of gases comprising:
(i) one or more gaseous sources of boron;
(ii) one or more gaseous sources of phosphorus;
(iii) a gaseous source of oxygen containing at least 1 vol. % $O_3$, and
(iv) tetraethylorthosilicate (TEOS) as the gaseous source of silicon, with the ratio of TEOS to $O_3$ ranging from about 1:100 to about 2:1;
to form said void-free first BPSG layer; and
(b) depositing a plasma assisted CVD capping layer of BPSG over said CVD layer, in a vacuum chamber, by using a mixture of gases comprising:
(i) one or more gaseous sources of boron;
(ii) one or more gaseous sources of phosphorus;
(iii) one or more gaseous sources of oxygen, and
(iv) tetraethylorthosilicate (TEOS) as the gaseous source of silicon, with the ratio of TEOS to $O_3$ ranging from about 1:100 to about 2:1;
while maintaining a plasma in said chamber at a power level of at least about 25 watts to form said non-porous and non-hygroscopic BPSG cap layer.

16. A process for forming a composite layer of boron phosphorus silicate glass (BPSG) over stepped surfaces of a semiconductor wafer which comprises:
(a) depositing a first CVD base layer of BPSG on said wafer, in a vacuum chamber, by flowing into said vacuum chamber a mixture of gases comprising one or more gaseous sources of boron, one or more gaseous sources of phosphorus, a gaseous source of oxygen, and tetraethylorthosilicate as the gaseous source of silicon, while maintaining a wafer temperature during said deposition not exceeding about 600° C.; and
(b) depositing a plasma assisted CVD capping layer of BPSG over said CVD layer, in a vacuum chamber, by using a mixture of gases comprising one or more gaseous sources of boron, one or more gaseous sources of phosphorus, a gaseous source of oxygen, and tetraethylorthosilicate as the gaseous source of silicon, while maintaining a plasma in said chamber at a power level of at least about 25 watts, and while maintaining a wafer temperature during said deposition not exceeding about 600° C.

17. A process for forming a composite layer of boron phosphorus silicate glass (BPSG) over stepped surfaces of a semiconductor wafer which comprises:
(a) depositing a first CVD base layer of BPSG on said wafer, in a vacuum chamber, by flowing into said vacuum chamber a mixture of gases comprising one or more gaseous sources of boron, one or more gaseous sources of phosphorus, a gaseous source of oxygen, and tetraethylorthosilicate as the gaseous source of silicon, while maintaining a pressure in said chamber of at least about 40 Torr; and
(b) depositing a plasma assisted CVD capping layer of BPSG over said CVD layer, in said vacuum chamber, by using a mixture of gases comprising one or more gaseous sources of boron, one or more gaseous sources of phosphorus, a gaseous source of oxygen, and tetraethylorthosilicate as the gaseous source of silicon, while maintaining a plasma in said chamber at a power level of at least about 25 watts, and while maintaining a pressure in said chamber of at least about 40 Torr.

* * * * *